(12) United States Patent
Cho et al.

(10) Patent No.: US 10,741,615 B2
(45) Date of Patent: Aug. 11, 2020

(54) DISPLAY DEVICE

(71) Applicant: LG Display Co., Ltd., Seoul (KR)

(72) Inventors: Mingu Cho, Goyang-si (KR); Dojin Kim, Goyang-si (KR); Miae Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 95 days.

(21) Appl. No.: 15/856,423

(22) Filed: Dec. 28, 2017

(65) Prior Publication Data

US 2018/0190730 A1 Jul. 5, 2018

(30) Foreign Application Priority Data

Dec. 30, 2016 (KR) .................. 10-2016-0184013

(51) Int. Cl.
*H01L 27/32* (2006.01)
*H01L 51/52* (2006.01)
*H01L 51/00* (2006.01)

(52) U.S. Cl.
CPC ...... *H01L 27/3213* (2013.01); *H01L 27/3258* (2013.01); *H01L 27/3276* (2013.01); *H01L 51/0096* (2013.01); *H01L 51/5203* (2013.01); *H01L 51/5262* (2013.01); *G09G 2310/0264* (2013.01); *Y02E 10/549* (2013.01)

(58) Field of Classification Search
CPC ............ H01L 27/3258; H01L 27/3213; H01L 51/0096; H01L 51/5262; H01L 27/3276; H01L 51/5203; H01L 27/3244; H01L 51/5253; H01L 51/5275; Y02E 10/549; G09G 2310/0264
See application file for complete search history.

(56) References Cited

U.S. PATENT DOCUMENTS

| 2013/0193456 A1* | 8/2013 | Lee ................ H01L 27/3213 257/88 |
| 2016/0062520 A1* | 3/2016 | Choi ................ G09G 5/003 345/174 |
| 2016/0380039 A1* | 12/2016 | Oh ................ H01L 27/3276 257/40 |
| 2018/0095566 A1* | 4/2018 | Lee ................ G06F 3/0412 |
| 2018/0145115 A1* | 5/2018 | Shimizu ............ G09F 9/30 |

FOREIGN PATENT DOCUMENTS

| CN | 1702532 A | 11/2005 |
| CN | 102456705 A | 5/2012 |
| CN | 102751333 A | 10/2012 |
| WO | 2016/076187 A1 | 5/2016 |

OTHER PUBLICATIONS

Office Action dated Jun. 4, 2019 in connection with the counterpart CN Application No. 201711364194.3 (14 pages).

* cited by examiner

*Primary Examiner* — Latanya N Crawford
(74) *Attorney, Agent, or Firm* — Polsinelli PC (57) ABSTRACT

A display device is disclosed. The display device includes a substrate including first to fourth subpixels, a first buffer layer positioned on the substrate, the first buffer layer including a silicon nitride layer and a silicon oxide layer, and a thin film transistor and an organic light emitting diode positioned on the first buffer layer. Each of the first to fourth subpixels includes an emission portion and a non-emission portion. A thickness of the silicon nitride layer in the non-emission portion is greater than a thickness of the silicon nitride layer in the emission portion.

17 Claims, 8 Drawing Sheets

DISPLAY DEVICE

CROSS REFERENCE TO RELATED APPLICATION

This application claims the priority benefit of Korean Patent Application No. 10-2016-0184013 filed on Dec. 30, 2016, which is incorporated herein by reference for all purposes as if fully set forth herein.

BACKGROUND

Field of the Disclosure

The present disclosure relates to a display device. Although the present disclosure is suitable for a wide scope of application, it is particularly suitable for preventing a loss of light and thereby increasing a light transmittance of the display device.

Description of the Background

Various types of flat panel displays (FPDs) have been used to replace heavier and bulkier cathode ray tubes (CRTs). Examples of the flat panel displays include a liquid crystal display (LCD), a field emission display (FED), a plasma display panel (PDP), and an organic light emitting diode (OLED) display. Among them, an OLED display is a self-emission display device emitting light by exciting an organic compound. The OLED display does not require a backlight unit as needed in a liquid crystal display, and thus, has a thin profile, light weight, and a simple manufacturing process. The OLED display can be also manufactured at a low temperature and has characteristics including a fast response time of 1 ms or less, low power consumption, a wide viewing angle, a high contrast, and the like.

Further, the OLED display includes an emission layer formed of an organic material between a first electrode serving as an anode and a second electrode functioning as a cathode. The OLED display forms hole-electron pairs, i.e., excitons, by combining holes received from the first electrode with electrons received from the second electrode inside the emission layer and emits light by energy generated when the excitons return to the ground level. The OLED display is generally classified into a bottom emission OLED display and a top emission OLED display depending on the direction of light emitted from the OLED device. The bottom emission OLED display emits light in a downward direction toward a substrate, i.e., the direction from an emission layer to a first electrode. The top emission OLED display emits light in an upward direction away from a substrate, i.e., the direction from an emission layer to a second electrode.

In the bottom emission OLED display, light emitted from an emission layer is transmitted by a plurality of layers and is emitted to the outside. A multi-buffer layer alternately laminating a silicon oxide layer and a silicon nitride layer is positioned directly on a substrate of the OLED display. The silicon nitride layer has a high refractive index of about 1.9 to 2.0, and thus has a problem that a loss of light occurs at an interface between the silicon nitride layer and the silicon oxide layer.

SUMMARY

The present disclosure provides a display device capable of increasing a light transmittance by preventing a loss of light.

In one aspect, there is provided a display device comprising a substrate including first to fourth subpixels, a first buffer layer positioned on the substrate, the first buffer layer including a silicon nitride layer and a silicon oxide layer, and a thin film transistor and an organic light emitting diode positioned on the first buffer layer, wherein each of the first to fourth subpixels includes an emission portion and a non-emission portion, and wherein a thickness of the silicon nitride layer in the non-emission portion is greater than a thickness of the silicon nitride layer in the emission portion.

The first subpixel is a red subpixel, the second subpixel is a white subpixel, the third subpixel is a blue subpixel, and the fourth subpixel is a green subpixel.

The silicon oxide layer has a thickness of 3,000 Å to 7,000 Å.

The thickness of the silicon nitride layer in the non-emission portion is 500 Å to 1,000 Å.

A thickness of the silicon nitride layer in the emission portion of the blue subpixel is less than thicknesses of the silicon nitride layers in the emission portions of the white, red, and green subpixels.

A thickness of the silicon nitride layer in the emission portion of the first subpixel is 800 Å to 880 Å, a thickness of the silicon nitride layer in the emission portion of the second subpixel is 670 Å to 750 Å, a thickness of the silicon nitride layer in the emission portion of the third subpixel is 550 Å to 600 Å, and a thickness of the silicon nitride layer in the emission portion of the fourth subpixel is 670 Å to 750 Å.

The first buffer layer includes the silicon nitride layer on the substrate and the silicon oxide layer on the silicon nitride layer.

The silicon nitride layer includes a first silicon nitride layer and a second silicon nitride layer. The first buffer layer includes the first silicon nitride layer on the substrate, the silicon oxide layer on the first silicon nitride layer, and the second silicon nitride layer on the silicon oxide layer.

The silicon nitride layer includes a first silicon nitride layer and a second silicon nitride layer, and the silicon oxide layer includes a first silicon oxide layer and a second silicon oxide layer. The first buffer layer includes the first silicon nitride layer on the substrate, the first silicon oxide layer on the first silicon nitride layer, the second silicon nitride layer on the first silicon oxide layer, and the second silicon oxide layer on the second silicon nitride layer.

The display device further comprises a second buffer layer between the first buffer layer and the thin film transistor.

In another aspect of the present disclosure, a display device comprises first to fourth subpixels defined on a substrate and each subpixel having red, white, blue and green emission portions and a non-emission portion; and a first buffer layer disposed on the substrate and including a silicon nitride layer, wherein the silicon nitride layer corresponding to the blue emission portion has a thickness different from those of the silicon nitride layer corresponding to the red, white and green emission portions to prevent from decreasing light transmittance in a range from a green wavelength to a maximum visible light wavelength.

In a further aspect of the present disclosure, a display device comprises first to fourth subpixels defined on a substrate and each subpixel having red, white, blue and green emission portions and a non-emission portion; and a first buffer layer disposed on the substrate and including a silicon nitride layer and a silicon oxide layer, at least one of the silicon nitride layer and the silicon oxide layer having more than one layers, wherein the at least one of the silicon nitride layer and the silicon oxide layer corresponding to the blue emission portion has a thickness different from those of the silicon nitride layer corresponding to the red, white and green emission portions to prevent from decreasing light transmittance from green and higher wavelength bands.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead aspects of the disclosure. Names of the respective elements used in the following explanations are selected only for convenience of writing the specification and may be thus different from those used in actual products.

A display device according to an aspect of the disclosure may be implemented as an organic light emitting diode (OLED) display, a liquid crystal display (LCD), an electrophoresis display, and the like. Aspects of the disclosure are described using the OLED display by way of example. An OLED display includes an emission layer that is formed of an organic material between a first electrode serving as an anode and a second electrode serving as a cathode. The OLED display is a self-emission display device configured to form hole-electron pairs, i.e., excitons, by combining holes received from the first electrode and electrons received from the second electrode inside the emission layer and emit light by energy generated when the excitons return to a ground level. The OLED display according to the aspect of the disclosure may be a plastic display device in which a display element is formed on a flexible plastic substrate rather than a glass substrate.

Figure 1:
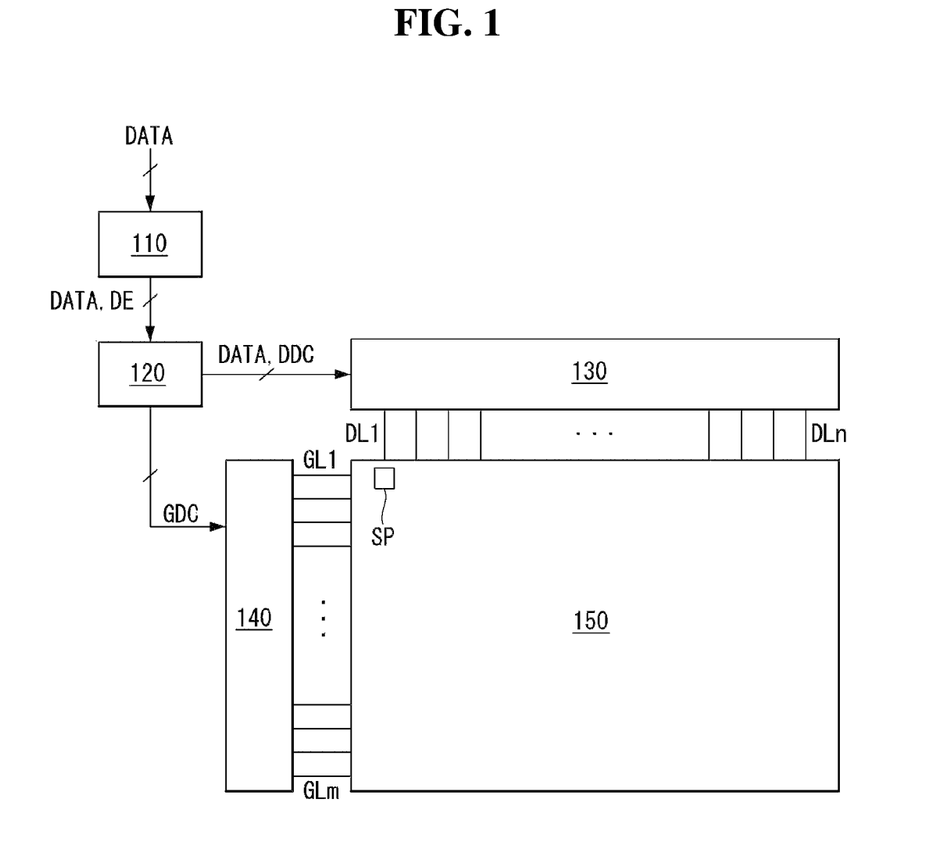
FIG. 1 is a schematic block diagram of an organic light emitting diode (OLED) display according to an aspect of the disclosure.
Figure 2:
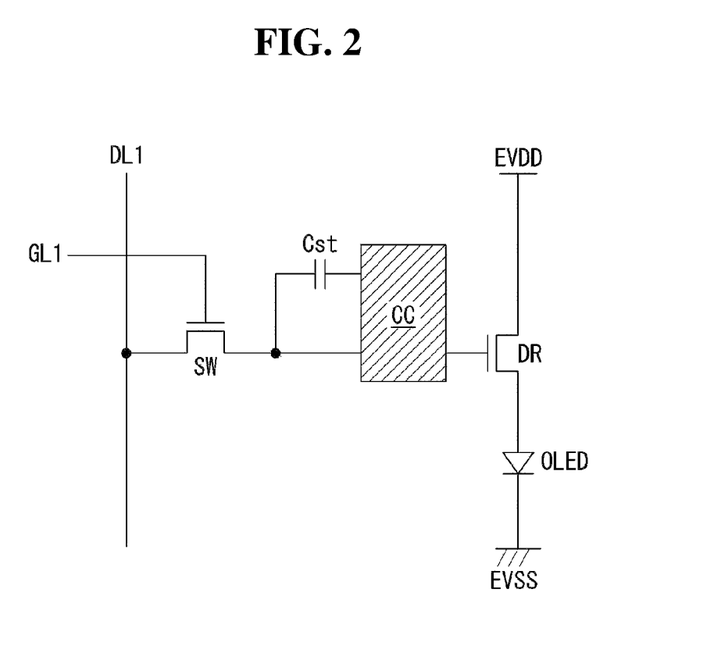
FIG. 2 schematically illustrates a circuit configuration of a subpixel.
Figure 3:
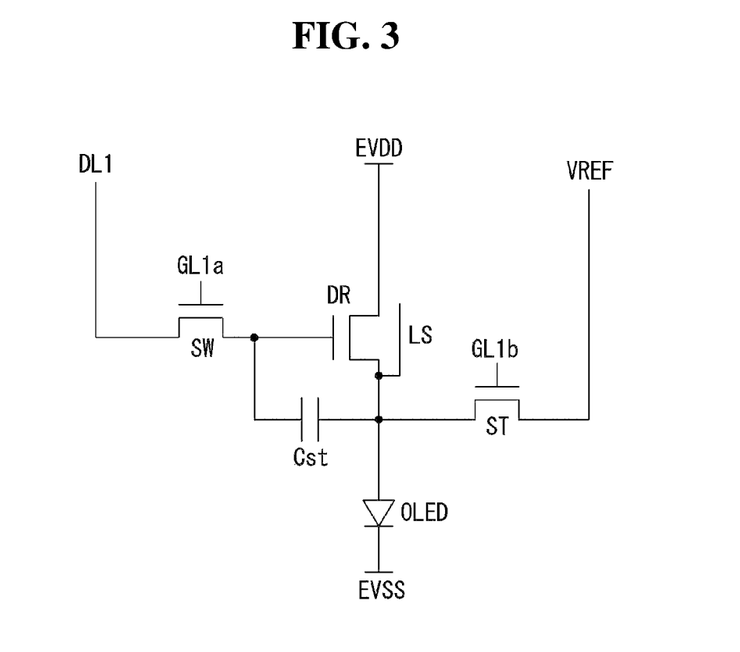
FIG. 3 illustrates an example of a circuit configuration of a subpixel according to an aspect of the disclosure.
Figure 4:
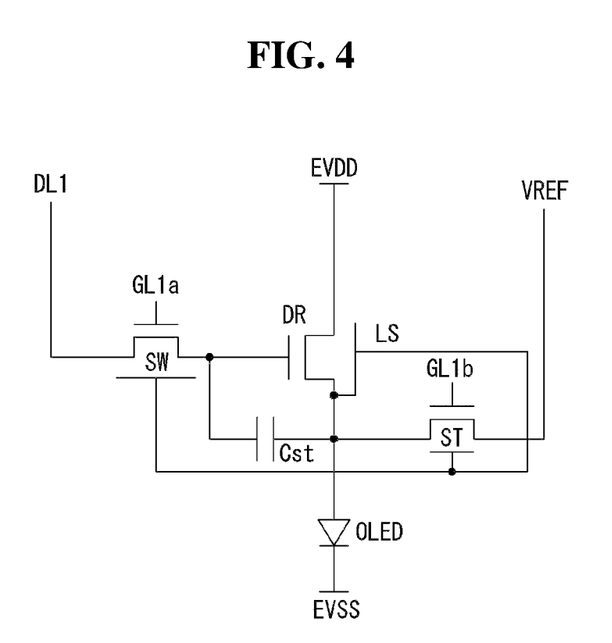
FIG. 4 illustrates another example of a circuit configuration of a subpixel according to an aspect of the disclosure.

FIG. 1 is a schematic block diagram of an organic light emitting diode (OLED) display according to an aspect of the disclosure. FIG. 2 schematically illustrates a circuit configuration of a subpixel. FIG. 3 illustrates an example of a circuit configuration of a subpixel according to an aspect of the disclosure. FIG. 4 illustrates another example of a circuit configuration of a subpixel according to an aspect of the disclosure.

As shown in FIG. 1, an OLED display according to an aspect of the disclosure may include an image processing unit 110, a timing controller 120, a data driver 130, a scan driver 140, and a display panel 150.

The image processing unit 110 outputs a data signal DATA, a data enable signal DE, etc. supplied from the outside. The image processing unit 110 may output one or more of a vertical sync signal, a horizontal sync signal, and a clock signal in addition to the data enable signal DE. For the sake of convenience, these signals are not shown.

The timing controller 120 receives the data signal DATA and driving signals including the data enable signal DE or the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC received from the timing controller 120 and converts the sampled and latched data signal DATA into a gamma reference voltage. The data driver 130 outputs the data signal DATA to data lines DL1 to DLn. The data driver 130 may be formed in the form of an integrated circuit (IC).

The scan driver 140 outputs a scan signal while shifting a level of a gate voltage in response to the gate timing control signal GDC received from the timing controller 120. The scan driver 140 outputs the scan signal to scan lines GL1 to GLm. The scan driver 140 may be formed in the form of an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP operated to display an image.

The subpixels SP may be configured as a top emission structure, a bottom emission structure, or a dual emission structure. The subpixels SP may include red subpixels, green subpixels, and blue subpixels, or may include white subpixels, red subpixels, green subpixels, and blue subpixels. Further, the subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL1. The driving transistor DR enables a driving current to flow between a first power line EVDD and a second power line EVSS based on the data voltage stored in the capacitor Cst. The organic light emitting diode OLED emits light depending on the driving current formed by the driving transistor DR.

The compensation circuit CC is a circuit added to the subpixel and compensates for a threshold voltage of the driving transistor DR. The compensation circuit CC includes one or more transistors. Configuration of the compensation circuit CC may be variously changed depending on a compensation method and is described below with reference to FIGS. 3 and 4.

As shown in FIGS. 3 and 4, the compensation circuit CC includes a sensing transistor ST and a sensing line VREF. The sensing transistor ST is connected to a sensing node between a source line of the driving transistor DR and an anode electrode (or referred to as "first electrode") of the organic light emitting diode OLED. The sensing transistor ST may operate to supply an initialization voltage (or referred to as "sensing voltage") transferred through the sensing line VREF to the sensing node or to sense a voltage or a current of the sensing node.

A source electrode of the switching transistor SW is connected to the first data line DL1, and a drain electrode of the switching transistor SW is connected to a gate electrode of the driving transistor DR. A source electrode of the driving transistor DR is connected to the first power line EVDD, and a drain electrode of the driving transistor DR is connected to the anode electrode of the organic light emitting diode OLED. A lower electrode of the capacitor Cst is connected to the gate electrode of the driving transistor DR, and an upper electrode of the capacitor Cst is connected to the anode electrode of the organic light emitting diode OLED. The anode electrode of the organic light emitting diode OLED is connected to the drain electrode of the driving transistor DR, and a cathode electrode of the organic light emitting diode OLED is connected to the second power line EVSS. A source electrode of the sensing transistor ST is connected to the sensing line VREF, and a drain electrode of the sensing transistor ST is connected to the anode electrode of the organic light emitting diode OLED corresponding to the sensing node.

An operation time of the sensing transistor ST may be similar to (or the same as) or different from that of the switching transistor SW depending on a compensation algorithm (or the configuration of the compensation circuit). For example, a gate electrode of the switching transistor SW may be connected to a 1a scan line GL1a, and a gate electrode of the sensing transistor ST may be connected to a 1b scan line GL1b. As another example, the 1a scan line GL1a connected to the gate electrode of the switching transistor SW and the 1b scan line GL1b connected to the gate electrode of the sensing transistor ST may be commonly connected.

The sensing line VREF may be connected to the data driver. In this instance, the data driver may sense the sensing node of the subpixel during a non-display period of a real-time image or N frame and generate a sensing result, where N is an integer equal to or greater than 1. On the other hand, the switching transistor SW and the sensing transistor ST may be turned on at the same time. In this instance, a sensing operation through the sensing line VREF and a data output operation for outputting the data signal are separated (or distinguished) from each other based on a time division manner of the data driver.

In addition, a target to be compensated based on the sensing result may be a digital data signal, an analog data signal, a gamma signal, or the like. The compensation circuit for generating a compensation signal (or a compensation voltage) based on the sensing result may be implemented inside the data driver, inside the timing controller, or inside a separate circuit.

FIGS. 3 and 4 illustrate the subpixel having the configuration of 3T(Transistor)1C(Capacitor) including the switching transistor SW, the driving transistor DR, the capacitor Cst, the organic light emitting diode OLED and the sensing transistor ST, by way of example. However, when the compensation circuit CC is added to the subpixel, the subpixel may have various configurations such as 3T2C, 4T2C, 5T1C and 6T2C.

There is a difference between the subpixel circuit of FIG. 3 and the subpixel circuit of FIG. 4 in configuration of a light shielding layer LS. The light shielding layer LS functions to shield external light. When the light shielding layer LS is formed of a metallic material, a charged parasitic voltage becomes problematic. Therefore, the light shielding layer LS is connected to the source electrode of the driving transistor DR.

More specifically, as shown in FIG. 3, the light shielding layer LS may be disposed only below a channel region of the driving transistor DR. Alternatively, as shown in FIG. 4, the light shielding layer LS may be disposed below the channel region of the driving transistor DR and below channel regions of the switching transistor SW and the sensing transistor ST.

The light shielding layer LS may be used for shielding the external light as shown in FIG. 3. In addition, the light shielding layer LS may be connected to another electrode or another line and used as an electrode constituting the capacitor, and the like.

A structure of a subpixel array of the display device according to an aspect of the disclosure will be described in detail below.

Figure 5:
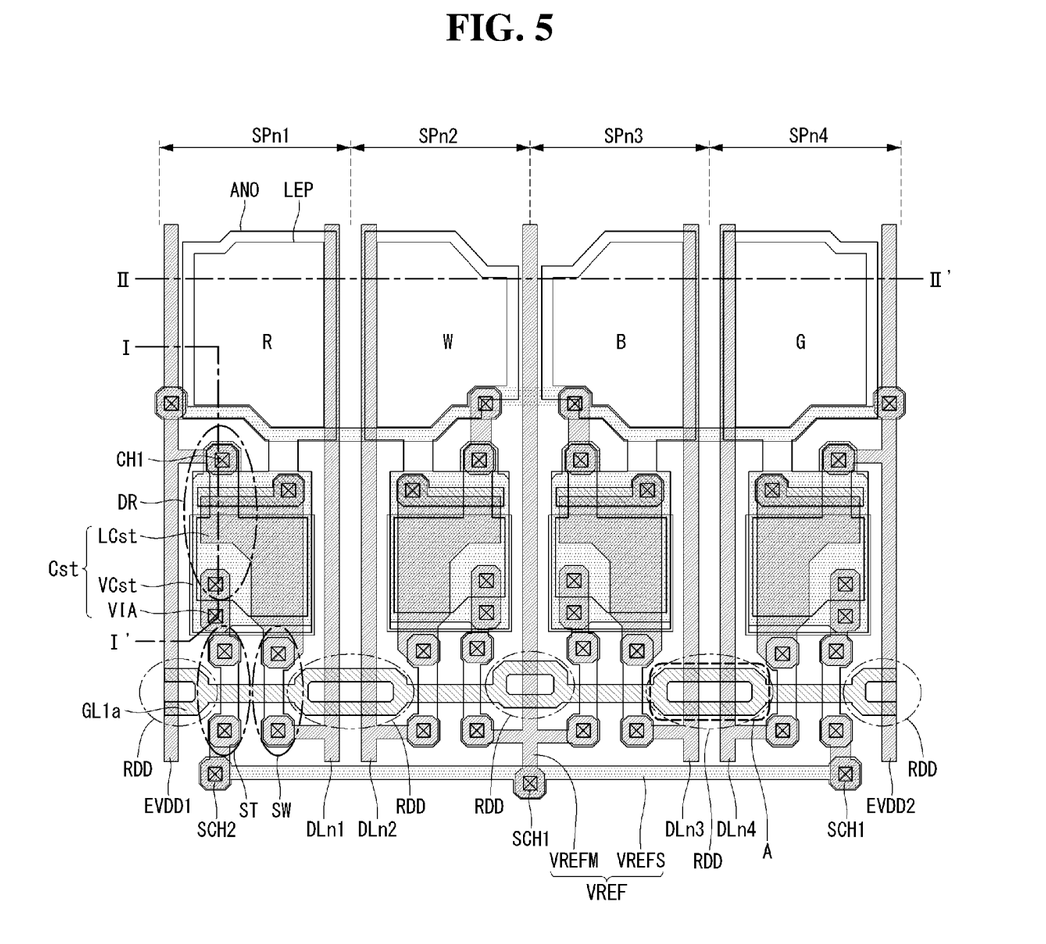
FIG. 5 is a plan view of a subpixel array according to an aspect of the disclosure.
Figure 6:
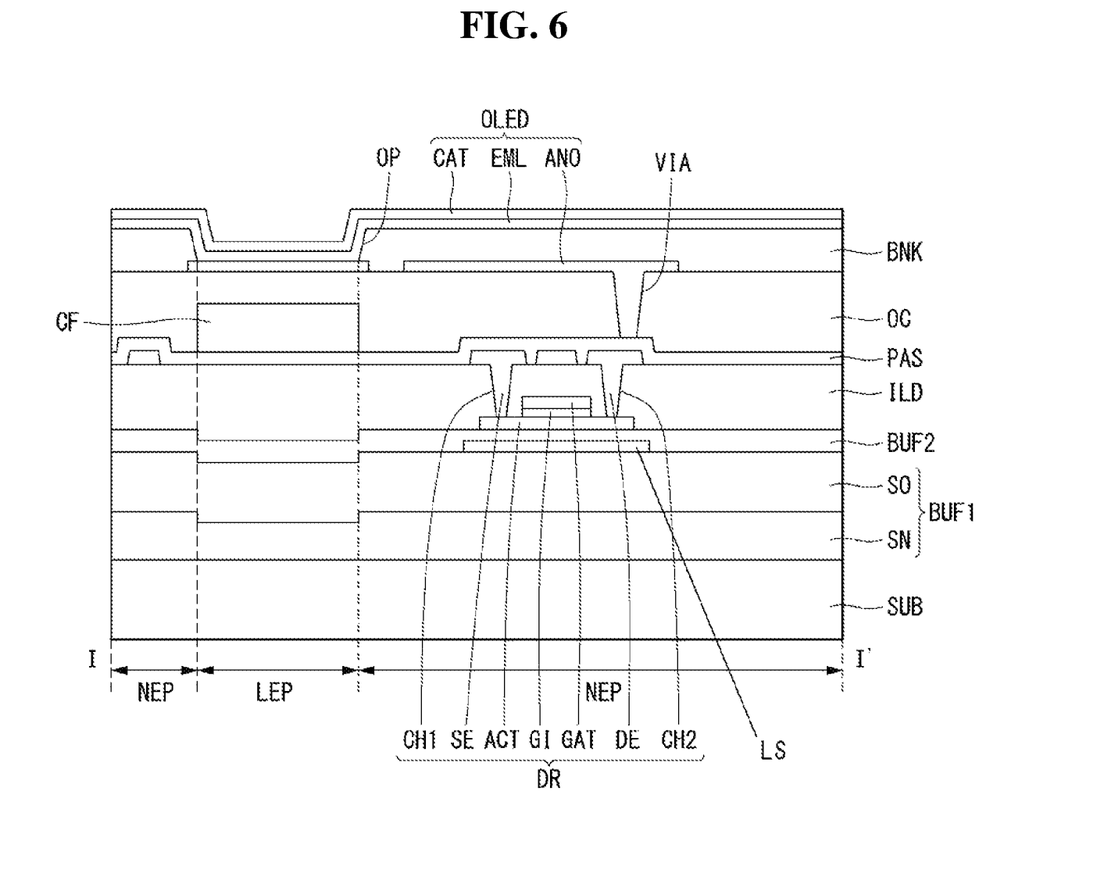
FIG. 6 is a cross-sectional view taken along line I-I' of FIG. 5.
Figure 7:
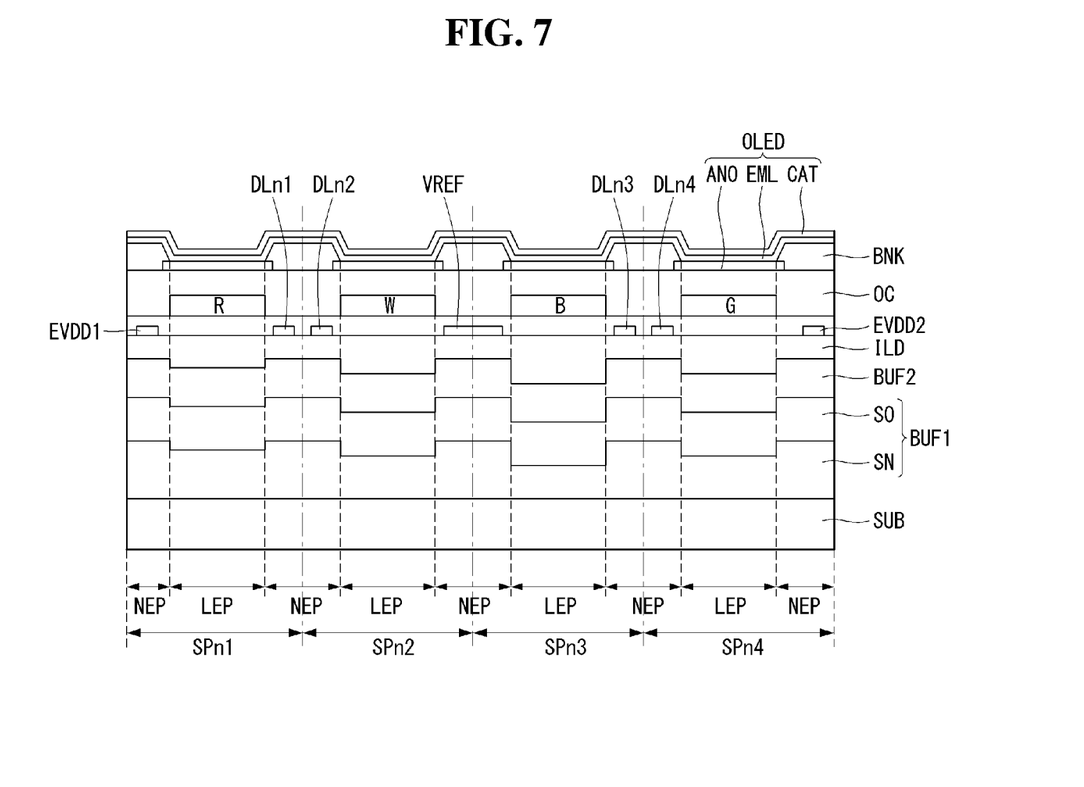
FIG. 7 is a cross-sectional view taken along line II-II' of FIG. 5.
Figure 8:
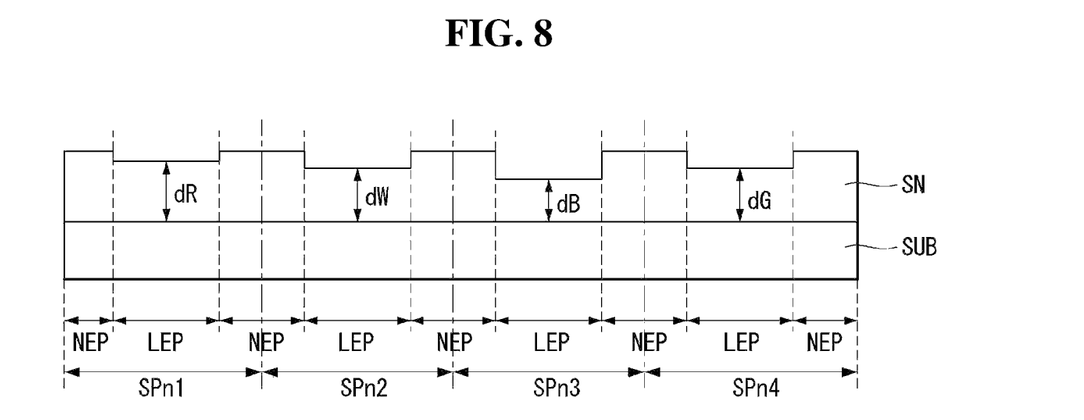
FIG. 8 is a cross-sectional view illustrating first buffer layers of respective subpixels.
Figure 9:
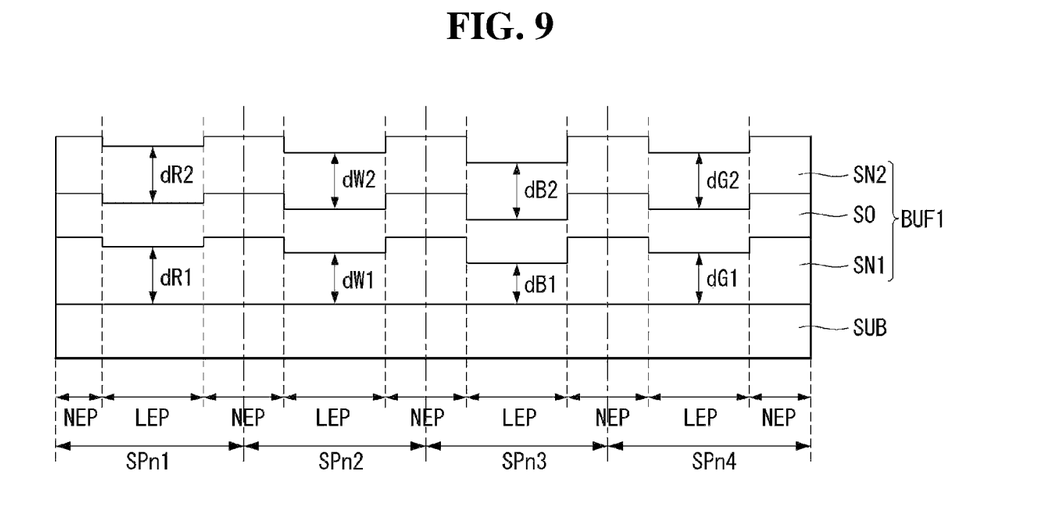
FIGS. 9 and 10 are cross-sectional views illustrating laminated structures of a first buffer layer according to an aspect of the disclosure.
Figure 10:
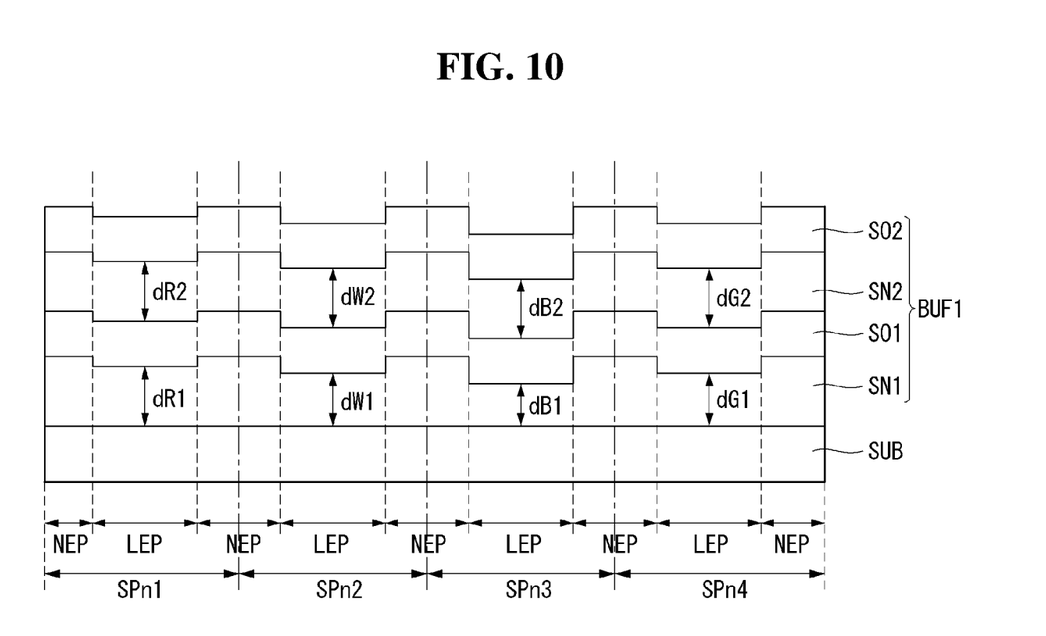

FIG. 5 is a plan view of a subpixel array according to an aspect of the disclosure. FIG. 6 is a cross-sectional view taken along line I-I' of FIG. 5. FIG. 7 is a cross-sectional view taken along line II-II' of FIG. 5. FIG. 8 is a cross-sectional view illustrating first buffer layers of respective subpixels. FIGS. 9 and 10 are cross-sectional views illustrating laminated structures of a first buffer layer according to an aspect of the disclosure.

With reference to FIG. 5, first to fourth subpixels SPn1 to SPn4 are arranged in a horizontal direction. For example, the first subpixel SPn1 may be a red subpixel R, the second subpixel SPn2 may be a white subpixel W, and the third subpixel SPn3 may be a blue subpixel B. The fourth subpixel SPn4 may be selected to be a green subpixel G. In some aspects, the first to third subpixels SPn1 to SPn3 may form a unit pixel, and three subpixels including the fourth subpixel SPn4 and two subpixels subsequent to the fourth subpixel SPn4 may form a unit pixel. For example, each of RWB, GRW, and BGR may form a unit pixel. Alternatively, the first to fourth subpixels SPn1 to SPn4 may form a unit pixel, and each of RWBG and RWBG may form a unit pixel.

A first power line EVDD1 is disposed on the left side of the first subpixel SPn1 along a vertical direction. The first power line EVDD1 is commonly connected to the first subpixel SPn1 and the second subpixel SPn2. Although not shown, the first power line EVDD1 may be commonly connected to two other subpixels disposed on the left side of the first power line EVDD1. Namely, the first power line EVDD1 according to an aspect of the present disclosure is commonly connected to four subpixels.

A first data line DLn1 is disposed in an area that is positioned adjacent to the first power line EVDD1 with the first subpixel SPn1 interposed therebetween, and a second data line DLn2 is disposed adjacent to the first data line DLn1 in the second subpixel SPn2. The first data line DLn1 is connected to the first subpixel SPn1, and the second data line DLn2 is connected to the second subpixel SPn2. A sensing line VREF is disposed between the second subpixel SPn2 and the third subpixel SPn3. The sensing line VREF is commonly connected to the first to fourth subpixels SPn1 to SPn4.

A third data line DLn3 is disposed in an area that is positioned adjacent to the sensing line VREF with the third subpixel SPn3 interposed therebetween, and a fourth data line DLn4 is disposed adjacent to third data line DLn3 in the fourth subpixel SPn4. The third data line DLn3 is connected to the third subpixel SPn3, and the fourth data line DLn4 is connected to the fourth subpixel SPn4. A second power line EVDD2 is disposed on the right side of the fourth subpixel SPn4 along the vertical direction. The second power line EVDD2 is commonly connected to the third subpixel SPn3 and the fourth subpixel SPn4. Although not shown, the second power line EVDD2 may be commonly connected to two other subpixels disposed on the right side of the second power line EVDD2. Namely, the second power line EVDD2 according to an aspect of the present disclosure is commonly connected to four subpixels.

A scan line GL1$a$ perpendicularly intersecting the sensing line VREF is disposed on the first to fourth subpixels SPn1 to SPn4. The scan line GL1$a$ corresponds to gate electrodes of a sensing transistor ST and a switching transistor SW of each of the first to fourth subpixels SPn1 to SPn4. Although one scan line GL1$a$ has been shown and described in aspects of the disclosure, two scan lines may be provided.

The sensing line VREF includes a vertical sensing line VREFM disposed along the vertical direction and a horizontal sensing line VREFS disposed along the horizontal direction. The vertical sensing line VREFM and the horizontal sensing line VREFS are connected to a first sensing hole SCH1. The vertical sensing line VREFM is disposed in parallel with the second and third data lines DLn2 and DLn3, and the horizontal sensing line VREFS is disposed in parallel with the scan line GL1$a$. The sensing transistors ST of each of the first to fourth subpixels SPn1 to SPn4 is connected to the vertical sensing line VREFM via the horizontal sensing line VREFS through second sensing holes SCH2 respectively positioned at both ends of the horizontal sensing line VREFS.

A plan structure of the subpixel is described using the first subpixel SPn1 as an example. The switching transistor SW is disposed at an intersection of the first data line DLn1 and the scan line GL1$a$. The sensing transistor ST is disposed adjacent to the second sensing holes SCH2 of the horizontal sensing line VREFS and the scan line GL1$a$.

A capacitor Cst includes a lower capacitor electrode LCst connected to the first power line EVDD1 through a first contact hole CH1 and an upper capacitor electrode UCst extended from a switching transistor ST. A driving transistor DR is disposed adjacent to the capacitor Cst, and a first electrode ANO is connected to the driving transistor DR through a via-hole VIA. An emission unit LEP for emitting light is disposed on the first electrode ANO. Hence, a plan structure of the first subpixel SPn1 is formed.

More specifically, a cross-sectional structure of the display panel will be described below using a portion of the first subpixel as an example.

As shown in FIG. 6, a first buffer layer BUF1 is positioned on a substrate SUB. The substrate SUB may be a glass substrate or a plastic substrate. In aspects of the disclosure, the substrate SUB may be a flexible plastic substrate. The first buffer layer BUF1 blocks ions or impurities diffused from the substrate SUB and prevents moisture penetration from the outside. The first buffer layer BUF1 at least includes a silicon nitride layer SN and a silicon oxide layer SO. The first buffer layer BUF1 will be described in detail later.

A light shielding layer LS is positioned on the first buffer layer BUF1. The light shielding layer LS shields light coming from the outside and prevents a leakage current from being generated in a transistor. Thus, the light shielding layer LS is formed corresponding to a channel region of a transistor. For example, the light shielding layer LS is formed corresponding to a channel region of a driving transistor, or is separately formed corresponding to channel regions of a sensing transistor and a switching transistor. A second buffer layer BUF2 is positioned on the light shielding layer LS including the first buffer layer BUF1. The second buffer layer BUF2 protects transistors to be formed in a subsequent process from impurities, for example, alkali ions discharged from the light shielding layer LS or the substrate SUB. The second buffer layer BUF2 may be formed of a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized polycrystalline silicon. The polycrystalline silicon has a high mobility (for example, more than 100 cm$^2$/Vs), low power consumption, and excellent reliability. Thus, the polycrystalline silicon can be applied to a gate driver and/or a multiplexer (MUX) for use in a driving element or applied to a driving transistor of each pixel. Because the oxide semiconductor has a low OFF-current, the oxide semiconductor is suitable for a switching transistor which has a short ON-time and a long OFF-time. Further, because the oxide semiconductor can increase a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide (SiOx) layer, a silicon nitride (SiNx) layer, or a multilayer thereof. A gate electrode GAT is positioned on the gate insulating layer GI at a location corresponding to a predetermined region (e.g., the channel region when impurities are injected) of the semiconductor layer ACT. The gate electrode GAT may be formed of one of molybdenum (Mo), aluminum (Al), chrome (Cr), gold (Au), titanium (Ti), nickel (Ni), neodymium (Nd), and copper (Cu), or a combination thereof. Further, the gate electrode GAT may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode GAT may be formed as a double layer of Mo/Al—Nd or Mo/Al.

An interlayer dielectric layer ILD may be positioned on the gate electrode GAT and insulates the gate electrode GAT. The interlayer dielectric layer ILD may be a silicon oxide (SiOx) layer, a silicon nitride (SiNx) layer, or a multilayer thereof. First and second contact holes CH1 and CH2 exposing a portion of the semiconductor layer ACT are formed in a portion of each of the interlayer dielectric layer ILD (and the gate insulating layer GI if the gate insulating layer GI extends over the entire upper surface of the semiconductor layer ACT).

A drain electrode DE and a source electrode SE are positioned on the interlayer dielectric layer ILD. The source electrode SE is connected to the semiconductor layer ACT through the first contact hole CH1 exposing the source region of the semiconductor layer ACT. The drain electrode DE is connected to the semiconductor layer ACT through the second contact hole CH2 exposing a portion of the drain region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), and copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al—Nd/Mo.

Thus, the driving transistor DR including the semiconductor layer ACT, the gate electrode GAT, the source electrode SE, and the drain electrode DE is formed.

Further, a passivation layer PAS is positioned on the substrate SUB including the driving transistor DR. The passivation layer PAS is an insulating layer protecting the components underlying the passivation layer PAS and may be formed of a silicon oxide (SiOx) layer, a silicon nitride (SiNx) layer, or a multilayer thereof. A color filter CF is positioned on the passivation layer PAS. The color filter CF converts white light emitted by an organic light emitting diode OLED into one of red, green, and blue light. In an aspect disclosed herein, a red color filter CF may be used by way of example. An overcoat layer OC is positioned on the color filter CF. The overcoat layer OC may be a planarization layer for reducing a height difference of an underlying structure and may be formed of an organic material such as polyimide, benzocyclobutene-based resin, and acrylate. The overcoat layer OC may be formed through a spin-on glass (SOG) method for coating the organic material in a liquid state and then curing the organic material.

A via hole VIA exposing the drain electrode DE of the driving transistor DR is positioned in a portion of the overcoat layer OC. The organic light emitting diode OLED is positioned on the overcoat layer OC. More specifically, the organic light emitting diode OLED includes a first electrode ANO on the overcoat layer OC. The first electrode ANO serves as a pixel electrode and is connected to the drain electrode DE of the driving transistor DR through the via hole VIA. The first electrode ANO is an anode electrode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels is positioned on the substrate SUB including the first electrode ANO. The bank layer BNK may be formed of an organic material such as polyimide, benzocyclobutene-based resin, and acrylate. The bank layer BNK includes a pixel definition portion exposing the first electrode ANO. An emission layer EML contacting the first electrode ANO is positioned in the pixel definition portion of the bank layer BNK. The emission layer EML is a layer, in which electrons and holes combine and emit light. The organic light emitting diode OLED may include a hole injection layer and/or a hole transport layer between the emission layer EML and the first electrode ANO and may include an electron injection layer and/or an electron transport layer on the emission layer EML.

The organic light emitting diode OLED includes a second electrode CAT on the emission layer EML. The second electrode CAT may be positioned on an entire surface of a display area of the substrate SUB. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

An aspect of the disclosure includes the first buffer layer BUF1 directly on the substrate SUB, in order to block ions or impurities diffused from the substrate SUB and prevent moisture penetration from the outside. Each subpixel includes an emission portion LEP which emits light, and a non-emission portion NEP excluding the emission portion LEP from the subpixel. In the aspect of the disclosure, a thickness of the silicon nitride layer SN of the first buffer layer BUF1 in the emission portion LEP is less than a thickness of the silicon nitride layer SN of the first buffer layer BUF1 in the non-emission portion NEP.

More specifically, referring to FIGS. 7 and 8, first to fourth subpixels SPn1 to SPn4 are disposed on the substrate SUB. Each of the first to fourth subpixels SPn1 to SPn4 includes an emission portion LEP and a non-emission portion NEP. The emission portion LEP is a portion that substantially emits light, and may be a contact portion between the emission layer EML and the first electrode ANO. The non-emission portion NEP is a portion excluding the emission portion LEP from the subpixel.

The first buffer layer BUF1 is positioned on the substrate SUB. The first buffer layer BUF1 includes a silicon nitride layer SN and a silicon oxide layer SO on the silicon nitride layer SN. A thickness of the silicon oxide layer SO may be 3,000 Å to 7,000 Å. When the thickness of the silicon oxide layer SO is equal to or greater than 3,000 Å, a resistance to moisture permeability of the silicon oxide layer SO can be secured. Further, when the thickness of the silicon oxide layer SO is equal to or less than 7,000 Å, a crack can be prevented from being generated in the silicon oxide layer SO due to an increase in a stress of the silicon oxide layer SO depending on the flexibility of the substrate SUB.

In the first subpixel SPn1, a thickness of the silicon nitride layer SN of the first buffer layer BUF1 in the emission portion LEP is less than a thickness of the silicon nitride layer SN of the first buffer layer BUF1 in the non-emission portion NEP. In the same manner as the first subpixel SPn1, in each of the second to fourth subpixels SPn2 to SPn4, a thickness of the silicon nitride layer SN in the emission portion LEP is less than a thickness of the silicon nitride layer SN in the non-emission portion NEP.

In each of the first to fourth subpixels SPn1 to SPn4, a thickness D of the silicon nitride layer SN in the non-emission portion NEP may be 500 Å to 1,000 Å. When the thickness D of the silicon nitride layer SN in the non-emission portion NEP is equal to or greater than 500 Å, the silicon nitride layer SN can be properly formed, and a resistance to moisture permeability of the silicon nitride layer SN can be secured. Further, when the thickness D of the silicon nitride layer SN in the non-emission portion NEP is equal to or less than 1,000 Å, hydrogen of the silicon nitride layer SN can be prevented from adversely affecting a threshold voltage Vth of an oxide semiconductor layer. The first to fourth subpixels SPn1 to SPn4 are the same in the thickness D of the silicon nitride layer SN of the non-emission portion NEP.

In FIGS. 7 and 8, for example, the first subpixel SPn1 may be a red subpixel; the second subpixel SPn2 may be a white subpixel; the third subpixel SPn3 may be a blue subpixel; and the fourth subpixel SPn4 may be a green subpixel. In the OLED display according to an aspect of the disclosure, transmittances of red, green, blue, and white light are different from one another depending on properties of an emission material. Hence, in an aspect of the disclosure, a thickness of the silicon nitride layer SN disposed on a light path is adjusted to improve a transmittance of light, in order to increase a transmittance of light having a relatively low transmittance among the red, green, blue, and white light.

In the emission portion LEP of each subpixel, the thickness of the silicon nitride layer SN can be expressed by the following Equation (1) according to a wavelength of light transmitted by the silicon nitride layer SN and a transmittance of the silicon nitride layer SN.

$$d = \text{Wavelength}(\lambda)/4n \quad (1)$$

where "n" is a transmittance of the silicon nitride layer, and "d" is a thickness (unit: nm) of the silicon nitride layer.

More specifically, considering a transmittance of the silicon nitride layer SN in the first subpixel SPn1 is 1.88 and the first subpixel SPn1 has a red wavelength band, a thickness dR of the silicon nitride layer SN may be from 800 Å to 880 Å. In the same manner as the first subpixel SPn1, considering the second subpixel SPn2 has a white wavelength band (using a green wavelength band corresponding to a middle wavelength value because white light represents all of red, green, and blue light), a thickness dW of the silicon nitride layer SN may be from 670 Å to 750 Å. Considering the third subpixel SPn3 has a blue wavelength band, a thickness dB of the silicon nitride layer SN may be from 550 Å to 600 Å. Considering the fourth subpixel SPn4 has a green wavelength band, a thickness dG of the silicon nitride layer SN may be from 670 Å to 750 Å. The thicknesses of the silicon nitride layer SN are values taking account of a tolerance. Because a transmittance of the blue light is less than transmittances of the white, red, and green light, the thickness of the silicon nitride layer SN in the emission portion of the blue subpixel is less than the thicknesses of the silicon nitride layers SN in the emission portions of the white, red, and green subpixels.

As described above, an aspect of the disclosure sets a thickness of the silicon nitride layer positioned on a light path of each subpixel to have an optimum value in consideration of a wavelength of each subpixel, in order to improve transmittances of red, green, blue, and white light. Thus, the aspect of the disclosure has an advantage in improving the transmittances of the red, green, blue, and white light.

The aspect of the disclosure described that the first buffer layer BUF1 includes the silicon nitride layer SN and the silicon oxide layer SO each having a single-layered structure. However, aspects are not limited thereto. Other laminated structures may be used for the first buffer layer BUF1.

Referring to FIG. 9, a first buffer layer BUF1 is disposed on the substrate SUB. The first buffer layer BUF1 may include a first silicon nitride layer SN1, a silicon oxide layer SO, and a second silicon nitride layer SN2 that are sequentially laminated on the substrate SUB. Namely, the first silicon nitride layer SN1 may be disposed on the substrate SUB, the silicon oxide layer SO may be disposed on the first silicon nitride layer SN1, and the second silicon nitride layer SN2 may be disposed on the silicon oxide layer SO.

A thickness of a silicon nitride layer in an emission portion LEP of a first subpixel SPn1 is a sum (dR1+dR2) of a thickness dR1 of the first silicon nitride layer SN1 and a thickness dR2 of the second silicon nitride layer SN2 and may be from 800 Å to 880 Å. A thickness of a silicon nitride layer in an emission portion LEP of a second subpixel SPn2 is a sum (dW1+dW2) of a thickness dW1 of the first silicon nitride layer SN1 and a thickness dW2 of the second silicon nitride layer SN2 and may be from 670 Å to 750 Å. A thickness of a silicon nitride layer in an emission portion LEP of a third subpixel SPn3 is a sum (dB1+dB2) of a thickness dB1 of the first silicon nitride layer SN1 and a thickness dB2 of the second silicon nitride layer SN2 and may be from 550 Å to 600 Å. A thickness of a silicon nitride layer in an emission portion LEP of a fourth subpixel SPn4 is a sum (dG1+dG2) of a thickness dG1 of the first silicon nitride layer SN1 and a thickness dG2 of the second silicon nitride layer SN2 and may be 670 Å to 750 Å.

Furthermore, referring to FIG. 10, a first buffer layer BUF1 is disposed on the substrate SUB. The first buffer layer BUF1 may include a first silicon nitride layer SN1, a first silicon oxide layer 501, a second silicon nitride layer SN2, and a second silicon oxide layer SO2 that are sequentially laminated on the substrate SUB. Namely, the first silicon nitride layer SN1 may be disposed on the substrate SUB, the first silicon oxide layer SO1 may be disposed on the first silicon nitride layer SN1, the second silicon nitride layer SN2 may be disposed on the first silicon oxide layer SO1, and the second silicon oxide layer SO2 may be disposed on the second silicon nitride layer SN2.

In a structure illustrated in FIG. 10 in the same manner as the structure illustrated in FIG. 9, a thickness of a silicon nitride layer in an emission portion LEP of a first subpixel SPn1 is a sum (dR1+dR2) of a thickness dR1 of the first silicon nitride layer SN1 and a thickness dR2 of the second silicon nitride layer SN2 and may be from 800 Å to 880 Å. A thickness of a silicon nitride layer in an emission portion LEP of a second subpixel SPn2 is a sum (dW1+dW2) of a thickness dW1 of the first silicon nitride layer SN1 and a thickness dW2 of the second silicon nitride layer SN2 and may be from 670 Å to 750 Å. A thickness of a silicon nitride layer in an emission portion LEP of a third subpixel SPn3 is a sum (dB1+dB2) of a thickness dB1 of the first silicon nitride layer SN1 and a thickness dB2 of the second silicon nitride layer SN2 and may be from 550 Å to 600 Å. A thickness of a silicon nitride layer in an emission portion LEP of a fourth subpixel SPn4 is a sum (dG1+dG2) of a thickness dG1 of the first silicon nitride layer SN1 and a thickness dG2 of the second silicon nitride layer SN2 and may be from 670 Å to 750 Å.

The aspect of the disclosure does not limit the first buffer layer BUF1 to the above-described laminated structures illustrated in FIGS. 9 and 10. For example, the lamination order of the silicon nitride layer and the silicon oxide layer may be reversed.

Figure 11:
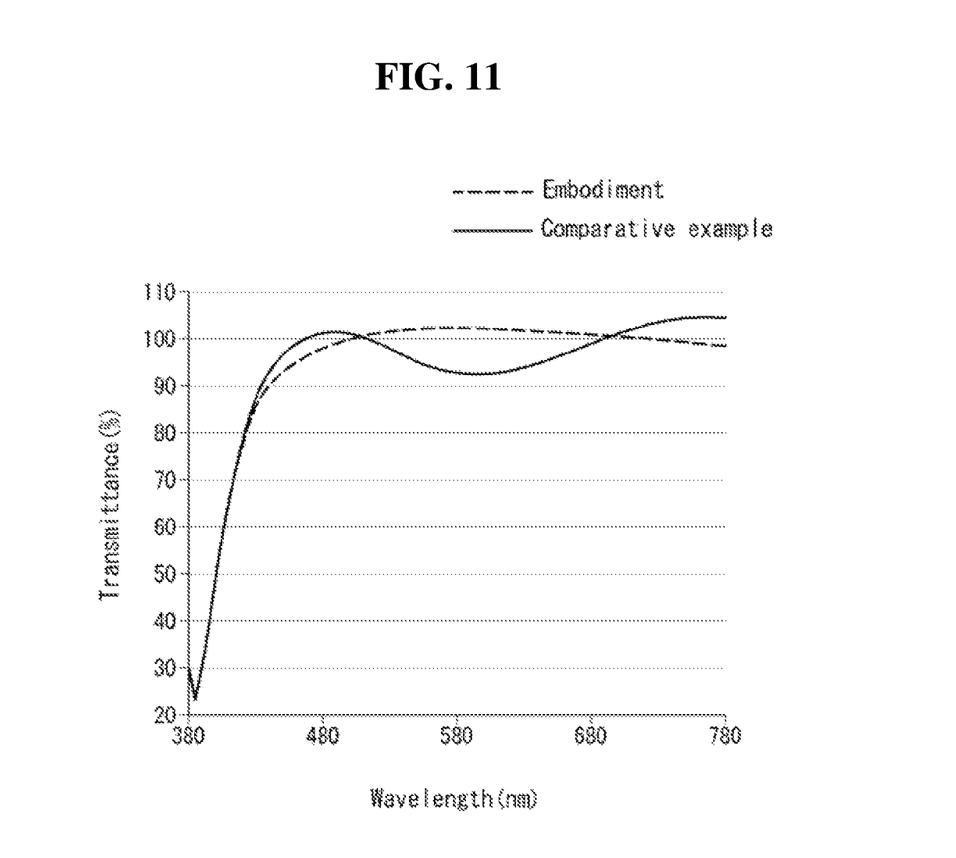
FIG. 11 is a graph illustrating a transmittance depending on a wavelength in OLED displays manufactured according to a comparative example and an aspect of the disclosure.

FIG. 11 is a graph illustrating a transmittance depending on a wavelength in OLED displays manufactured according to a comparative example and an aspect of the disclosure.

According to a comparative example, a silicon nitride layer was laminated on a front surface of a polyimide substrate to a thickness of 1,000 Å, and a silicon oxide layer was laminated on the silicon nitride layer to a thickness of 3,000 Å, thereby forming a first buffer layer. Afterwards, an OLED display according to the comparative example was manufactured in the same manner as FIG. 6 and had a structure including R, W, B, and G subpixels.

According to an aspect of the disclosure, a silicon nitride layer was laminated on a front surface of a polyimide substrate to a thickness of 1,000 Å, and then a silicon nitride layer of an emission portion was etched so that it had a thickness of 600 Å. Next, a silicon oxide layer was laminated on a front surface of the silicon nitride layer to a thickness of 3,000 Å. Thus, a first buffer layer including the silicon nitride layer and the silicon oxide layer was formed. Afterwards, an OLED display according to an aspect of the disclosure was manufactured in the same manner as FIG. 6 and had a structure including R, W, B, and G subpixels.

A transmittance depending on a wavelength in the OLED displays manufactured according to the comparative example and the aspect of the disclosure was measured and shown FIG. 11.

As shown in FIG. 11, the OLED display manufactured according to the comparative example had a low transmittance at green, yellow and up to visible light wavelength bands and had an average transmittance of 92.9%. On the other hand, the OLED display manufactured according to the aspect of the disclosure had a high transmittance at all of blue, green, and red wavelength bands and had an average transmittance of 100%.

As described above, the OLED display according to the aspect of the disclosure reduces the thickness of the silicon nitride layer in the emission portion of each subpixel and differently adjusts the thicknesses of the silicon nitride layers of the subpixels, thereby improving the light transmittance.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a substrate including first to fourth subpixels defined thereon, the first to fourth subpixels including a red subpixel, a white subpixel, a blue subpixel and a green subpixel;
    a first buffer layer positioned on the substrate, the first buffer layer including a silicon nitride layer and a silicon oxide layer; and
    a thin film transistor and an organic light emitting diode positioned on the first buffer layer,
    wherein each of the first to fourth subpixels includes an emission portion and a non-emission portion where the silicon nitride layer and a silicon oxide layer are positioned, and
    wherein a thickness of the silicon nitride layer in the emission portion of the blue subpixel is less than a thickness of the silicon nitride layer in the emission portions of the white, red and green subpixels.

2. The display device of claim 1, wherein the first subpixel is the red subpixel, the second subpixel is the white subpixel, the third subpixel is the blue subpixel, and the fourth subpixel is the green subpixel.

3. The display device of claim 1, wherein the silicon oxide layer has a thickness of 3,000 Å to 7,000 Å.

4. The display device of claim 1, wherein the thickness of the silicon nitride layer in the non-emission portion is 500 Å to 1,000 Å.

5. The display device of claim 2, wherein a thickness of the silicon nitride layer in the emission portion of the first subpixel is from 800 Å to 880 Å,
    wherein a thickness of the silicon nitride layer in the emission portion of the second subpixel is from 670 Å to 750 Å,
    wherein a thickness of the silicon nitride layer in the emission portion of the third subpixel is from 550 Å to 600 Å, and
    wherein a thickness of the silicon nitride layer in the emission portion of the fourth subpixel is from 670 Å to 750 Å.

6. The display device of claim 1, wherein the first buffer layer includes the silicon nitride layer on the substrate and the silicon oxide layer on the silicon nitride layer.

7. The display device of claim 1, wherein the silicon nitride layer includes a first silicon nitride layer and a second silicon nitride layer, and
    wherein the first buffer layer includes the first silicon nitride layer on the substrate, the silicon oxide layer on the first silicon nitride layer, and the second silicon nitride layer on the silicon oxide layer.

8. The display device of claim 1, wherein the silicon nitride layer includes a first silicon nitride layer and a second silicon nitride layer, and the silicon oxide layer includes a first silicon oxide layer and a second silicon oxide layer, and
    wherein the first buffer layer includes the first silicon nitride layer on the substrate, the first silicon oxide layer on the first silicon nitride layer, the second silicon nitride layer on the first silicon oxide layer, and the second silicon oxide layer on the second silicon nitride layer.

9. The display device of claim 1, further comprising a second buffer layer between the first buffer layer and the thin film transistor.

10. A display device comprising:
    first to fourth subpixels defined on a substrate and each subpixel having red, white, blue and green emission portions and a non-emission portion; and
    a first buffer layer disposed on the substrate and including a silicon nitride layer,
    wherein the silicon nitride layer corresponding to the blue emission portion has a thickness different from those of the silicon nitride layer corresponding to the red, white and green emission portions to prevent from decreasing light transmittance in a range from a green wavelength to a maximum visible light wavelength, and
    wherein the silicon nitride layer corresponding to the blue emission portion has a thickness less than those of the silicon nitride layer corresponding to the red, white and green emission portions.

11. The display device of claim 10, wherein the first buffer layer further comprises a silicon oxide layer.

12. The display device of claim 11, wherein the silicon oxide layer is disposed on the silicon nitride layer.

13. The display device of claim 10, further comprising a second buffer layer on the first buffer layer.

14. The display device of claim 10, wherein the silicon nitride layer in the non-emission portion has a thickness greater than that of the silicon nitride layer in the emission portion.

15. A display device comprising:
first to fourth subpixels defined on a substrate and each subpixel having red, white, blue and green emission portions and a non-emission portion; and
a first buffer layer disposed on the substrate and including a silicon nitride layer and a silicon oxide layer, at least one of the silicon nitride layer and the silicon oxide layer having more than one layers,
wherein the at least one of the silicon nitride layer and the silicon oxide layer corresponding to the blue emission portion has a thickness different from those of the silicon nitride layer corresponding to the red, white and green emission portions to prevent from decreasing light transmittance from green and higher wavelength bands, and
wherein the at least one of the silicon nitride layer and the silicon oxide layer corresponding to the blue emission portion has a thickness less than those of the silicon nitride layer corresponding to the red, white and green emission portions to increase light transmittance of the display device.

16. The display device of claim 15, wherein the silicon oxide layer is disposed on the silicon nitride layer.

17. The display device of claim 15, wherein the silicon nitride layer in the non-emission portion has a thickness greater than that of the silicon nitride layer in the emission portion.

* * * * *